(12) United States Patent
Kim

(10) Patent No.: US 8,581,475 B2
(45) Date of Patent: Nov. 12, 2013

(54) GENERATING DEVICE USING PIEZOELECTRIC ENERGY HARVESTER

(71) Applicants: In Seo Kim, Yangjoo-si (KR); Gui Hyeon Moon, Torrance, CA (US); Jong Ho Lee, Torrance, CA (US); Young Il Jung, Torrance, CA (US); Sok Hwan Han, Torrance, CA (US)

(72) Inventor: In Seo Kim, Yangjoo-si (KR)

(73) Assignees: In Seo Kim, Yangjoo-si, Gyeonggi-do (KR); Gui Hyeon Moon, Torrance, CA (US); Jong Ho Lee, Torrance, CA (US); Young Il Jung, Torrance, CA (US); Sok Hwan Han, Torrance, CA (US)

( * ) Notice: Subject to any disclaimer, the term of this patent is extended or adjusted under 35 U.S.C. 154(b) by 0 days.

(21) Appl. No.: 13/659,875

(22) Filed: Oct. 24, 2012

(65) Prior Publication Data

US 2013/0169114 A1    Jul. 4, 2013

(30) Foreign Application Priority Data

Dec. 28, 2011    (KR) .......................... 10-2011-0145292

(51) Int. Cl.
    *H01L 41/113*    (2006.01)
(52) U.S. Cl.
    CPC .................................... *H01L 41/113* (2013.01)
    USPC ...................................................... 310/339
(58) Field of Classification Search
    CPC .............. H01L 41/113; H01L 41/1134; H01L 41/1136; H01L 41/1138
    USPC .................................................. 310/339, 348
    See application file for complete search history.

(56) References Cited

U.S. PATENT DOCUMENTS

| 7,345,407 | B2 | 3/2008 | Tanner |
| 2008/0100182 | A1 | 5/2008 | Chang et al. |
| 2011/0260583 | A1* | 10/2011 | Lee et al. ...................... 310/339 |

FOREIGN PATENT DOCUMENTS

| JP | 2005323430 A | 11/2005 |
| KR | 100817319 B | 3/2008 |
| KR | 1020100024877 A | 3/2010 |

* cited by examiner

*Primary Examiner* — Derek Rosenau
(74) *Attorney, Agent, or Firm* — Revolution IP, PLLC

(57) ABSTRACT

Provided is a power generating apparatus using piezoelectric elements, which can increase an amount of electricity generated in the piezoelectric elements and can extend the life of the piezoelectric elements. The power generating apparatus includes: a plurality of piezoelectric elements; a main body in which the piezoelectric elements are received and fixed, with spaced apart from one another, so as to protect the piezoelectric elements; a piezoelectric element support reciprocatingly installed in the main body to support the piezoelectric elements such that the piezoelectric elements are deformed by a reciprocating motion of the piezoelectric element support; a driving unit provided in the main body to operate the piezoelectric element support; and a power transmission unit connecting the driving unit to the piezoelectric element support, such that the piezoelectric element support is reciprocated by a driving force of the driving unit.

8 Claims, 5 Drawing Sheets

GENERATING DEVICE USING PIEZOELECTRIC ENERGY HARVESTER

CROSS-REFERENCE TO RELATED APPLICATION

The present application claims priority from and the benefit of Korean Patent Application No. 10-2011-0145292, filed on Dec. 28, 2011, which is hereby incorporated by reference for all purposes as if fully set forth herein.

BACKGROUND OF THE INVENTION

1. Field of the Invention

Exemplary embodiments of the present invention relates to a power generating apparatus and method using piezoelectric elements. More particularly, to a power generating apparatus using piezoelectric elements, which can increase an amount of electricity generated from the piezoelectric elements and can extend the life of the piezoelectric elements.

2. Discussion of the Background

As depletion of petroleum comes closer, extensive research has recently been conducted throughout the world for seeking a variety of methods and apparatuses for a development of new alternative energy and effective conservation of energy during energy cycle.

For example, a power generating apparatus using the light of the sun has been most actively studied. In such a photovoltaic system, typically a solar cell array can be provided to directly receive the light of the sun, and a current generated from the solar cell array is charged to a battery through a constant voltage circuit which constantly maintains a voltage generated from the solar cell array.

An energy scavenger has recently been developed and applied, which can reduce battery consumption and/or can obtain electric energy from heat, vibration, or the light of the sun obtained from ambient environment, without using a battery system.

As is well known, piezoelectric materials can be implemented to various fields such as a core component of a piezoelectric power generator. A large number of materials including organic and inorganic materials known as a material causes a piezoelectric phenomenon. Materials, for example, PZT, BaTiO3, and Ba2TiO4, have been widely used as piezoelectric materials.

A piezoelectric element manufactured using the piezoelectric material generates an electricity when a force is applied thereto. A different electricity is generated according to a magnitude of an applied force. When manufacturing the piezoelectric power generator using the piezoelectric element, it is important to minimize loss of the piezoelectric element from an external shock or a vibration and effectively to transfer an electricity.

If excessive shock is transferred to the piezoelectric element, the piezoelectric element may be damaged. Therefore, there is a need for a structure that can effectively transfer external mechanical energy, and prevent excessive shock from being transferred. In particular, a piezoelectric element made of a ceramic has a strong brittle property. Therefore, there is a need for a housing that can effectively transfer mechanical energy, and prevent the piezoelectric element from being damaged by an excessive external force.

The conventional power generating apparatus using piezoelectric elements pressurizes the piezoelectric elements by applying shock and vibration to the piezoelectric elements. Therefore, an amount of electricity generated from the piezoelectric elements is small, and the life of the piezoelectric elements is shortened due to shock.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Therefore, the present invention has been made in an effort to solve the conventional problems, and is directed to provide a power generating apparatus using piezoelectric elements, which can increase an amount of electricity generated from the piezoelectric elements and can extend the life of the piezoelectric elements.

Exemplary embodiments of the present invention provide a method and apparatus of a power generating apparatus. The apparatus includes a plurality of piezoelectric elements. The apparatus also includes a main body in which the piezoelectric elements are received and fixed, with spaced apart from one another, so as to protect the piezoelectric elements. The apparatus includes a piezoelectric element support reciprocatingly installed in the main body to support the piezoelectric elements such that the piezoelectric elements are deformed by a reciprocating motion of the piezoelectric element support. The apparatus also includes a driving unit provided in the main body to operate the piezoelectric element support. The apparatus includes a power transmission unit connecting the driving unit to the piezoelectric element support, such that the piezoelectric element support is reciprocated by a driving force of the driving unit.

According to the exemplary embodiments of the present invention, both ends of the piezoelectric element may be fixed to the main body, and a central portion of the piezoelectric element may be fixed to the piezoelectric element support. Therefore, electricity can be generated in an entire area of the piezoelectric element and the piezoelectric element can entirely be deformed, thereby improving the durability of the piezoelectric element.

According to the exemplary embodiments of the present invention, the main body may include a base block having a receiving space portion in which the piezoelectric elements can be received, and a guide groove portion in which the piezoelectric element support may movably be mounted; and a cover member sealing the receiving space portion so as to prevent the piezoelectric elements installed in the receiving space portion from an exposure. Therefore, the piezoelectric elements can easily be supported and combined.

According to the exemplary embodiments of the present invention, the main body may include a fixing groove portion to which the piezoelectric elements can be inserted and fixed. As such, the piezoelectric elements can be easily combined.

According to the exemplary embodiments of the present invention, the piezoelectric element support may include a piezoelectric element support portion provided inside the main body to support the piezoelectric elements. And a connection portion extends from the piezoelectric element support portion, such that the connection portion is exposed to the outside of the main body. The connection portion is connected to the power transmission unit, and a guide portion extends from the piezoelectric element support portion and slidably is installed in the main body to prevent the piezoelectric element support portion from moving from side to side.

According to the exemplary embodiments of the present invention, the piezoelectric element support portion may include a support slot into which the piezoelectric element is inserted.

According to the exemplary embodiments of the present invention, the power transmission unit may include a rotary member connected to and rotated by the driving unit. And a link member having one end is rotatably connected to the rotary member and the other end is rotatably connected to the piezoelectric element support, such that the piezoelectric element support is reciprocated by the rotation of the rotary member. The power transmission unit can convert a rotational motion into a straight-line motion.

According to the exemplary embodiments of the present invention, the rotary member may be an eccentric shaft.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE INVENTION

Figure 1:
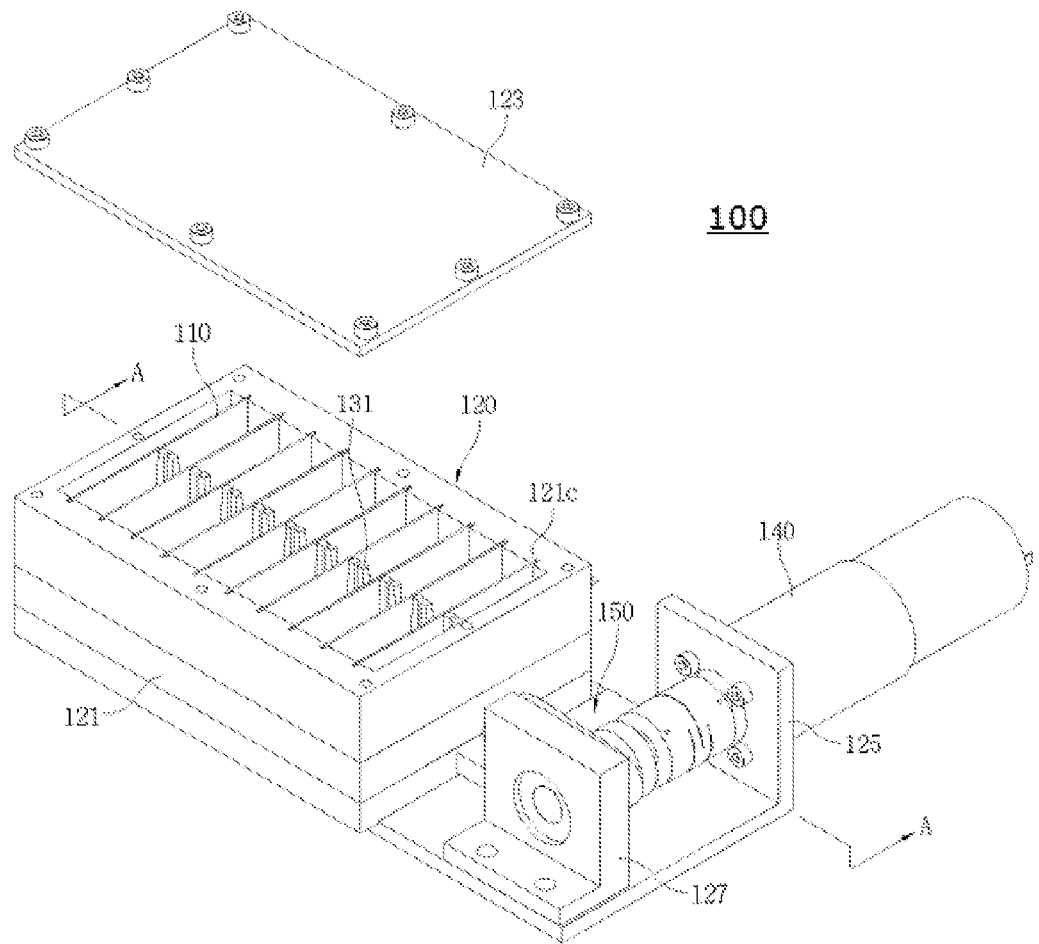
FIG. 1 is a perspective view of a power generating apparatus using piezoelectric elements according to exemplary embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

The exemplary embodiments and advantages of the present invention will become more apparent from the following detailed description when taken in conjunction with the accompanying drawings. The terms and words used in the present specification and claims should be interpreted as having meanings and concepts relevant to the technical scope of the present invention based on the rule according to which an inventor can appropriately define the concept of the term to describe most appropriately the best method he or she knows for carrying out the invention.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Hereinafter, a power generating apparatus using piezoelectric elements according to exemplary embodiments of the present invention will be described in detail with reference to the accompanying drawings.

Figure 2:
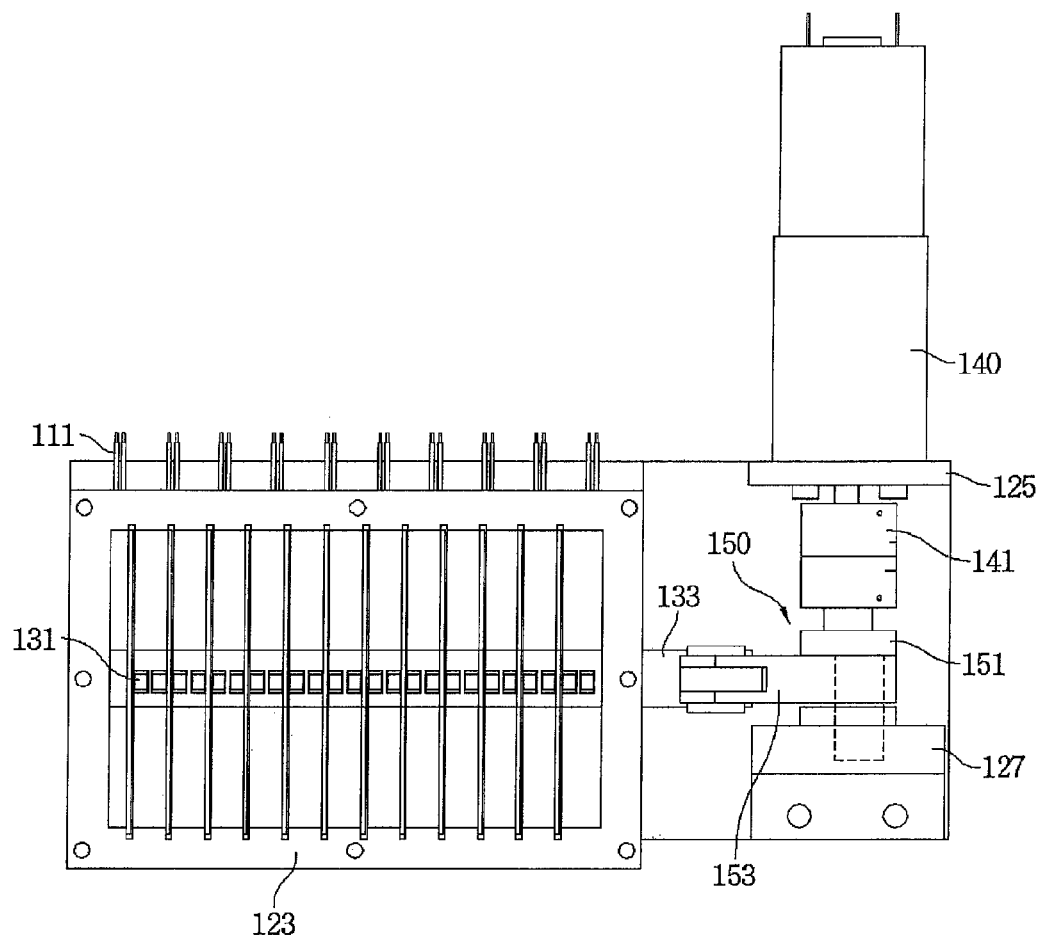
FIG. 2 is a plan view of FIG. 1.
Figure 3:
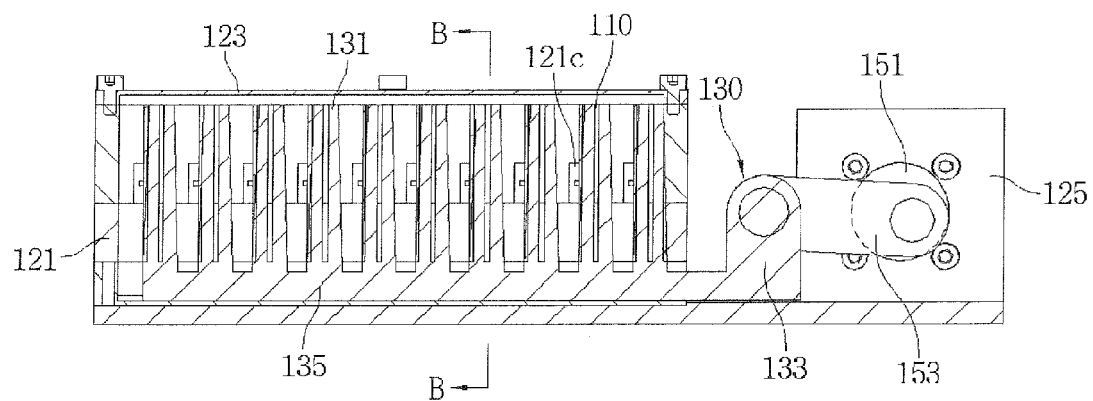
FIG. 3 is a cross-sectional view taken along line A-A of FIG. 1.
Figure 4:
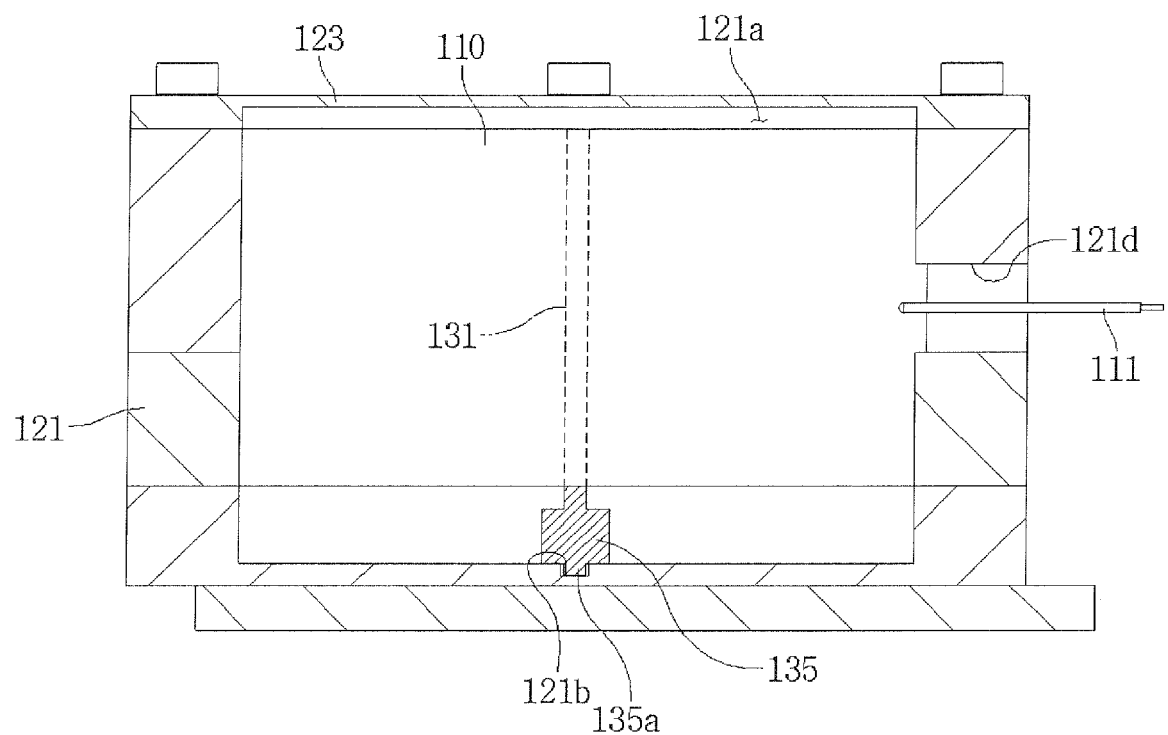
FIG. 4 is a cross-sectional view taken along line B-B of FIG. 3.
Figure 5:
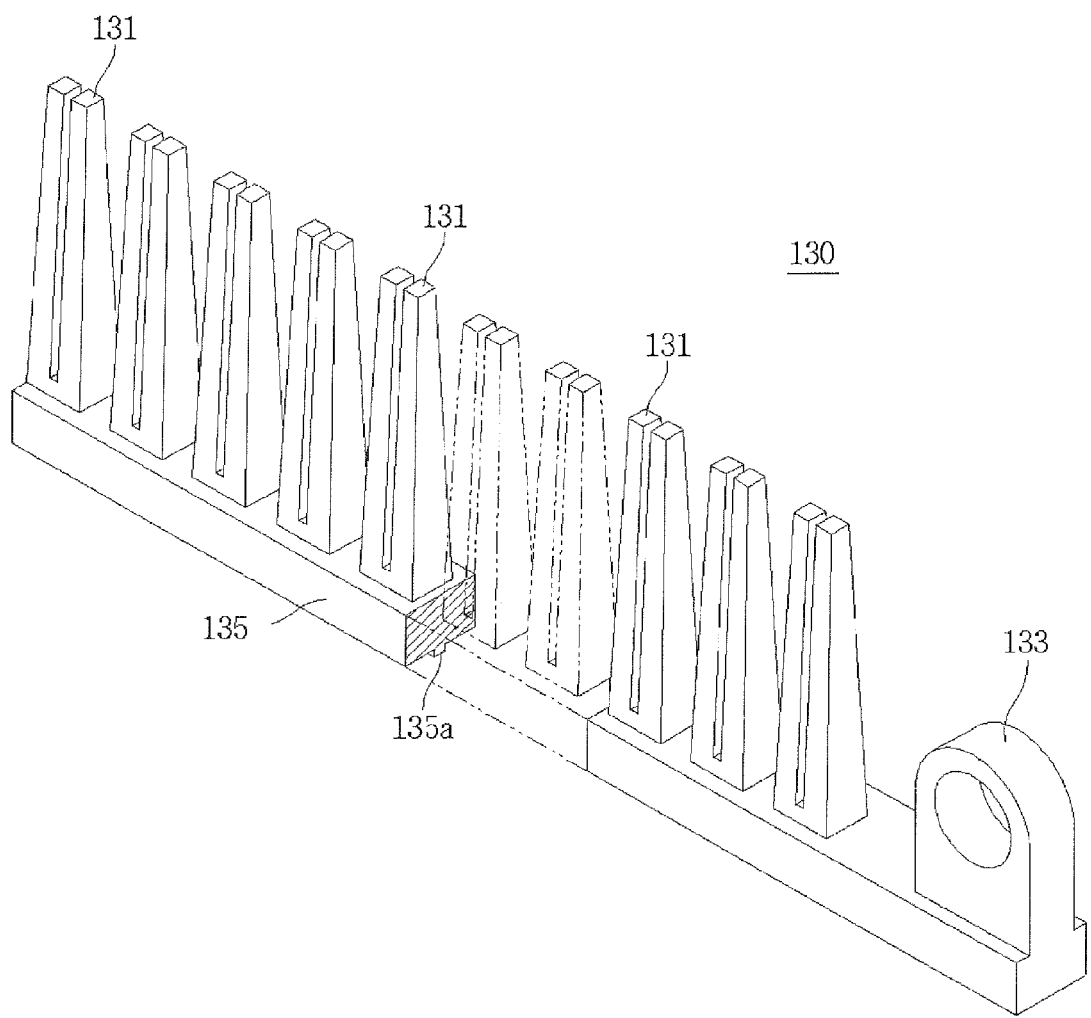
FIG. 5 is a perspective view of a piezoelectric element support according to exemplary embodiments of the present invention.

Referring to FIGS. 1 to 5, a power generating apparatus 100 using piezoelectric elements according to exemplary embodiments of the present invention generates electricity from piezoelectric elements 110 by pressurizing and deforming the piezoelectric elements 110 embedded therein.

According to exemplary embodiments, the power generating apparatus 100 using piezoelectric elements may include a plurality of piezoelectric elements 110, a main body 120 into which the piezoelectric elements 110 are embedded. A piezoelectric element support 130 pressurizes the piezoelectric elements 110, and a driving unit 140 can operate the piezoelectric element support 130, and a power transmission unit 150 connects the piezoelectric element support 130 to the driving unit 140.

For example, both ends of the piezoelectric element 110 can be fixed to the main body 120, and a central portion of the piezoelectric element 110 is supported to the piezoelectric element support 130. The piezoelectric element 110 may include an electrode terminal 111 at one side, such that electricity generated by the pressurization of the piezoelectric element support 130 is transmitted to the outside. The electrode terminal 111 is exposed to the outside of the main body 120.

In the main body 120, for example, the piezoelectric elements 110 can be received and fixed, with spaced apart from one another, so as to protect the piezoelectric elements 110, and the piezoelectric element support 130 can reciprocatingly be installed.

As an example, the main body 120 may include a base block 121, to which the piezoelectric elements 110 can be fixed, and a cover member 123 is connected to the base block 121 so as to protect the piezoelectric elements 110.

In the base block 121, for example, a receiving space portion 121a can be formed to receive the piezoelectric elements 110, and the receiving space portion 121a is covered by the cover member 123. Also, in the base block 121, for example, a guide groove portion 121b can be formed on the inner bottom of the receiving space portion 121a, such that the piezoelectric element support 130 is stably reciprocated. The bottom surface of the piezoelectric element support 130 can movably be mounted on the guide groove portion 121b.

According to exemplary embodiments, in the base block 121, fixing groove portions 121c, into which the piezoelectric element 110 can be inserted, are formed in the corresponding inner surface of the receiving space portion 121a, such that the piezoelectric element 110 received in the receiving space portion 121a can stably be fixed. For example, in the base block 121, a through-hole 121d can be formed at one side so as to expose the electrode terminal 111 of the piezoelectric element 110.

Since the receiving space portion 121a can be covered by the cover member 123, the base block 121 prevents the piezoelectric element 110 from being exposed to the outside.

It is contemplated that since the cover member 123 is connected to the base block 121 through a bolt, which is connected to the base block 121, and the cover member 123 covers the receiving space portion 121a, the exposure of the piezoelectric element 110 can be prevented.

For example, the main body 110 may further include a driving unit support portion 125 and an eccentric shaft support portion 127, which support the driving unit 140 and the power transmission unit 150, respectively. In this example, the driving unit 140 can be fixed to the driving unit support portion 125, and the power transmission unit 150 can rotatably be supported to the eccentric shaft support portion 127.

For example, the piezoelectric element support 130 can be installed in the base block 121, such that the piezoelectric element support 130 is reciprocated in a straight line. The piezoelectric element support 130 is reciprocated through the driving unit 140 to deform the plurality of piezoelectric elements 110. For this example, the piezoelectric element support 130 can pressurize the central portion of the piezoelectric element 110, and both ends of the central portion of the piezoelectric element 110 can be supported to the base block 121, through a straight-line motion. Therefore, the piezoelectric element 110 can uniformly be bent.

It is also contemplated that since the piezoelectric element 110 is uniformly bent in an arc shape by the piezoelectric element support 130, electricity can be generated in an entire area of the piezoelectric element 110, and a radio wave generated from the piezoelectric element 110 has a stable sine waveform. Moreover, since the piezoelectric element support 130 deforms the piezoelectric element 110, without striking the piezoelectric element 110, the life of the piezoelectric element 110 can advantageously be extended.

According to exemplary embodiments, the piezoelectric element support 130 may include a piezoelectric element support portion 131, a connection portion 133, and a guide portion 135. For example, the piezoelectric element support portion 131 can be disposed inside the receiving space portion 121a to support the piezoelectric element 110. The connection portion 133 connects the piezoelectric element support portion 131 to the power transmission unit 150. The guide portion 135 can slidably be installed in the guide groove portion 121b to guide the straight-line motion of the piezoelectric element support 130.

According to exemplary embodiments, the piezoelectric element support portion 131 can be provided in plurality at equal intervals to support the respective piezoelectric elements 110, and support slots 131a can be formed such that the piezoelectric elements 110 are inserted and supported thereto. It is contemplated that since the piezoelectric element support portion 131 deforms the piezoelectric element 110 while coming into contact with the piezoelectric element 110, a shock impact applied to the piezoelectric element 110 can significantly be reduced.

For example, the connection portion 133 extends from one side of the piezoelectric element support portion 131 and is exposed to the outside of the receiving space portion 121a, and a connection hole can be formed for connection to the power transmission unit 150.

For example, the guide portion 135 extends downward from the piezoelectric element support portion 131, and contacts the bottom of the receiving space portion 121a. Therefore, the guide portion 135 can stably guide the straight-line motion of the piezoelectric element support 130. For example, a guide rail 135a to be inserted into the guide groove portion 121b protrudes from the bottom surface of the guide portion 135. Hence, when the piezoelectric element support 130 moves in a straight line, the guide portion 135 can prevent the piezoelectric element support 130 from moving from side to side.

It is contemplated that since the piezoelectric element support 130 is prevented from moving from side to side, the guide portion 135 guides the piezoelectric element support 130 such that the reciprocating motion of the piezoelectric element support 130 is smoothly performed.

For example, the driving unit 140 is connected to the driving unit support portion 125 of the main body 120 through a bolt, and is connected to the power transmission unit 150 through a decelerator 141. For the driving unit 140 of the embodiment, a reversible motor may be used.

The power transmission unit 150 converts the rotational motion of the driving unit 140 into a straight-line motion, and transmits the straight-line motion to the piezoelectric element support 130.

As an example, the power transmission unit 150 may include a rotary member 151 connected to the decelerator 141, and a link member 153 connecting the rotary member 151 to the piezoelectric element support 130.

According to exemplary embodiments, as for the rotary member 151, an eccentric shaft may be used to convert the rotational force of the driving unit 140 into a straight reciprocating motion. In this example, the eccentric shaft can rotatably be connected to an eccentric shaft support portion 127 of the main body 120 through a bearing.

For example, the link member 153 may have one end rotatably connected to the rotary member 151 and the other end rotatably connected to the connection portion 133 of the piezoelectric element support 130, such that the piezoelectric element support 130 is reciprocated by the rotation of the rotary member 151.

Next, the operation and effect of the power generating apparatus using piezoelectric elements according to the embodiment of the present invention will be described.

When the driving unit 140 is operated, the rotary member 151 serving as the eccentric shaft is rotated. Due to the eccentricity of the rotary member 151, the link member 153 performs the straight reciprocating motion. The piezoelectric element support 130 connected to the link member 153 periodically pressurizes and deforms the piezoelectric element 110, while performing the straight reciprocating motion.

In this example, since the piezoelectric element 110 is bent while constantly changing to an arc shape by the piezoelectric element support 130, the radio wave generated by pressure has a sine waveform.

For example, when the piezoelectric element 110 is pressurized and deformed by the piezoelectric element support 130, the deformation is caused by not a strike but a gradually pressing force. Therefore, the damage of the piezoelectric element 110 is prevented, and the life of the piezoelectric element 110 is remarkably extended.

For example, while both ends of the piezoelectric element 110 are being supported to the main body 120, the piezoelectric element support 130 pressurizes the central portion of the piezoelectric element 110. Therefore, the deformation occurs in the entire area of the piezoelectric element 110. As a result, an amount of electricity generated from the piezoelectric element 110 can be more increased.

As described above, the power generating apparatus using the piezoelectric elements according to the exemplary embodiments of the present invention can increase an amount of electricity generated from the piezoelectric elements, and extend the life of the piezoelectric elements.

While the invention has been shown and described with reference to certain exemplary embodiments thereof, it will be understood by those skilled in the art that various changes in form and details may be made therein without departing from the spirit and scope of the invention as defined by the appended claims. Therefore, the scope of the invention cannot be defined only by the detailed description of the invention but by the appended claims, and various modifications and variation can be made in the present invention without departing from the spirit or scope of the invention will be construed as being included in the present invention.

What is claimed is:

1. A power generating apparatus comprising:
 a plurality of piezoelectric elements;
 a main body configured to receive the piezoelectric elements, the piezoelectric elements spaced apart from one another to protect the piezoelectric elements;
 a piezoelectric element support disposed at each center of the piezoelectric elements to support and to move the piezoelectric elements to pressurize and to deform the piezoelectric elements by using movable motion of the piezoelectric element support;
 a driving unit provided in the main body and configured to operate pressurizing and deforming the plurality of piezoelectric elements by operating the piezoelectric element support; and
 a power transmission unit, connecting the driving unit to the piezoelectric element support, configured to convert a rotational motion of the driving unit into a straight-line motion and to transmit the straight-line motion to the piezoelectric element support, wherein the piezoelectric elements are pressured and deformed,
 wherein a guide portion extends downward from the center of the piezoelectric element support, and to contact the bottom of a receiving space portion so as to stably guide the straight-line motion of the piezoelectric element support, and wherein a guide rail is inserted into a guide groove portion protruded from the bottom surface of the guide portion to prevent the piezoelectric element support from moving from side to side.

2. The power generating apparatus of claim 1, wherein both ends of the piezoelectric element are fixed to the main body, and a central portion of the piezoelectric element is fixed to the piezoelectric element support.

3. The power generating apparatus of claim 1, wherein the main body comprises:
 a base block comprising a receiving space portion in which the piezoelectric elements are received, and a guide groove portion in which the piezoelectric element support is movably mounted; and
 a cover member sealing the receiving space portion so as to prevent the exposure of the piezoelectric elements installed in the receiving space portion.

4. The power generating apparatus of claim 3, wherein the main body comprises a fixing groove portion provided in an inner surface of the receiving space portion, such that the piezoelectric elements are inserted and fixed thereto.

5. The power generating apparatus of claim 1, wherein the piezoelectric element support comprises:
 a piezoelectric element support portion disposed inside the main body to support the piezoelectric elements;
 a connection portion extending from the piezoelectric element support portion, such that the connection portion is exposed to the outside of the main body, the connection portion being connected to the power transmission unit; and
 the guide portion extending from the piezoelectric element support portion and slidably installed in the main body to prevent the piezoelectric element support portion from moving from side to side.

6. The power generating apparatus of claim 5, wherein the piezoelectric element support portion comprises a support slot into which the piezoelectric element is inserted.

7. The power generating apparatus of any one of claim 1, wherein the power transmission unit comprises:
 a rotary member connected to and rotated by the driving unit; and
 a link member having one end rotatably connected to the rotary member and the other end rotatably connected to the piezoelectric element support, such that the piezoelectric element support is moved by the rotation of the rotary member.

8. The power generating apparatus of claim 7, wherein the rotary member is an eccentric shaft.

* * * * *